United States Patent [19]
Numata et al.

[11] Patent Number: 5,654,567
[45] Date of Patent: Aug. 5, 1997

[54] CAPACITOR, ELECTRODE OR WIRING STRUCTURE, AND SEMI CONDUCTOR DEVICE

[75] Inventors: Ken Numata, Ibaraki-ken; Katsuhiro Aoki, Tsukuba; Yukio Fukuda, Ibaraki-ken; Akitoshi Nishimura, Tsuchiura, all of Japan

[73] Assignee: Texas Instruments Incorporated, Dallas, Tex.

[21] Appl. No.: 724,159

[22] Filed: Oct. 1, 1996

Related U.S. Application Data

[63] Continuation of Ser. No. 388,330, Feb. 14, 1995, abandoned.

[30] Foreign Application Priority Data

Feb. 14, 1994 [JP] Japan .................................. 6-039093

[51] Int. Cl.$^6$ .......................... H01L 29/78; H01L 23/48; H01L 27/02; H01L 29/68
[52] U.S. Cl. .......................... 257/306; 257/294; 257/297; 257/754; 257/762; 257/763; 257/764; 257/766; 257/758; 257/295
[58] Field of Search ........................ 257/306, 295, 257/308, 310, 294, 297, 532, 762, 763, 764, 758, 766, 759, 751

[56] References Cited

U.S. PATENT DOCUMENTS

| | | | |
|---|---|---|---|
| 4,644,386 | 2/1987 | Nishizawa et al. ...................... | 257/400 |
| 4,949,162 | 8/1990 | Tamaki et al. ........................... | 257/499 |
| 5,187,638 | 2/1993 | Sandhu et al. .......................... | 257/295 |
| 5,191,510 | 3/1993 | Huffman ................................. | 257/295 |
| 5,216,572 | 6/1993 | Larson et al. ........................... | 257/295 |
| 5,293,510 | 3/1994 | Takenaka ................................ | 257/306 |
| 5,335,138 | 8/1994 | Sandhu et al. .......................... | 257/310 |
| 5,434,742 | 7/1995 | Saito et al. .............................. | 361/305 |
| 5,436,477 | 7/1995 | Hashizume et al. .................... | 257/295 |
| 5,440,173 | 8/1995 | Evans, Jr. et al. ....................... | 257/751 |

FOREIGN PATENT DOCUMENTS 0136361  6/1991  Japan ..................................... 257/306

*Primary Examiner*—Sara W. Crane
*Assistant Examiner*—Alexander Oscar Williams
*Attorney, Agent, or Firm*—William B. Kempler; Richard L. Donaldson

[57] ABSTRACT

A capacitor, electrode, or wiring structure having an alpha ray emitting source (in particular, a Pt electrode), and an alpha ray shielding layer 18, having at least one type selected from the group of simple metals of nickel, cobalt, copper, and tungsten, their compounds or alloys made of at least two types of these simple metals, and compounds and alloys made of these simple metals and silicon is provided. It is possible to shield off the alpha ray effectively, to suppress generation of soft errors, to enable the use of Pt and other new materials in making the electrodes and wiring, and to reduce the cost of the mold resin.

23 Claims, 4 Drawing Sheets

CAPACITOR, ELECTRODE OR WIRING STRUCTURE, AND SEMI CONDUCTOR DEVICE

This application is a continuation of application Ser. No. 08/388,330, filed Feb. 14, 1995, now abandoned.

This invention concerns a type of capacitor, electrode or wiring structure, and a semiconductor device wherein a ferroelectric layer made of metal oxides is provided as an insulating layer.

BACKGROUND OF THE INVENTION

For the large-scale integrated circuit (LSI), the phenomenon in which the memory content disappears temporarily without accompanying physical damage of the device structure is known as a soft error. The main reason for a soft error is an alpha ray which is generated by the minute amount of radioactive nuclear seeds contained in the material of the LSI.

Among the materials that form the LSI—for example, silicon, oxygen, nitrogen, boron, phosphorus, arsenic, aluminum, titanium, tungsten, and copper—there are no natural radioactive isotopes, and the main sources of the alpha ray are uranium (U) and thorium (Th) contained as impurities. In order to alleviate the occurrence of a soft error in the LSI, it is necessary to reduce the content of uranium and thorium to the ppb level in the structural materials of the LSI.

On the other hand, there is still a high demand for increasing the degree of integration of the LSI. For this purpose, the oxide film-nitride film-oxide film structure (the so-called ONO structure) is adopted, and the steric structure of the cell capacitor of the dynamic random-access memory (DRAM) becomes more complicated. The reason is as follows: as the effective specific dielectric constant is selected at about 5 for the ONO structure, in order to ensure the electrical capacitance of the cell capacitor with respect to the shrinking cell area, efforts can be made only on the shape of the cell capacitor in order to guarantee the area. This, however, increases the burden on the manufacturing operation of a DRAM with respect to both technology and cost.

In order to solve this problem, oxides with a high permittivity such as tantalum oxide ($Ta_2O_5$), strontium titanate ($SrTiO_3$), BST ($Ba_xSr_{(1-x)}TiO_3$), PZT ($PbZr_xTi_{(1-x)}O_3$), etc., have been considered as insulating materials of a memory cell capacitor.

The most significant difference between these substances and silicon oxide and nitride is that these substances have a higher oxidizing power for silicon. Consequently, using a silicon electrode with these new types of insulating materials and selecting a type of material with a high oxidation resistance as the electrode is possible. At present, platinum is believed to be the candidate for this purpose.

However, platinum differs from the conventional elements used as the materials for LSIs in that it contains a radioactive isotope that emits alpha rays, that is, $Pt^{190}$ that can emit alpha rays with a kinetic energy of 3.18 MeV in $5.4 \times 10^{11}$ of radioactive half-life. The content of $Pt^{190}$ in platinum is 0.013%, and it is very difficult to isolate it when cost is a consideration. If the alpha ray level cannot be alleviated using certain methods, it is impossible to reduce the soft error level to the appropriate level for commercially using the platinum electrodes in manufacturing DRAMs.

For example, when a 2000-Å-thick platinum film is formed on a silicon substrate, the dose of the alpha ray emitted from the platinum film into silicon is 0.02 photon/h·cm². That is, one alpha ray photon on 10 cm² for 50 h. This calculated result is the number of alpha ray photons emitted from Pt into silicon.

For the DRAM, the soft error should be in the range of 500–1000 FIT (failure in time, where 1 FIT means that a defect takes place in 1 device among $10^9$ devices in 1 h). That is, 1000 FIT means that one soft error takes place in 1000 h for 1000 DRAMs. When the size of the DRAM's cell array portion is about 1 cm², the frequency for the soft error is on the order of about $10^{-6}$ photon/h·cm². Although not every alpha ray photon can lead to a soft error, the aforementioned value of 0.02 photon/h·cm² (the measured value is 0.007 photon/h·cm²) is still too high. On the other hand, if the amount of U, Th, and other radioactive elements in platinum can be kept to less than 10 ppb, it is acceptable to ignore the influence of the alpha ray caused by these radioactive elements.

Let us discuss the effect in alleviating the influence of the alpha ray generated by the platinum electrode in the conventional structure. When a ferroelectric material and platinum electrode are used corresponding to the DRAM, the COB (capacitor over bitline) structure shown in FIG. 16 is adopted for the following two purposes: to ensure the area of the cell capacitor and to prevent degradation of the cell capacitor portion in the high-temperature heat treatment for forming the other portions.

In this COB structure, a stack-type cell capacitor CAP is formed on the upper portion of wordline WL and bitline BL. Polysilicon 20 is used as the contact between the lower (platinum) electrode 16 of cell capacitor CAP and n⁺-type diffusion layer 3 (source region) of silicon substrate 1. In FIG. 16, 2 represents a field oxide film; 4 represents an n⁺-type diffusion layer (drain region); 5 represents a gate oxide film; 8 represents an upper electrode; 10 and 10' represent interlayer insulating films; 11 and 12 represent contact holes; 17 represents a dielectric material (such as PZT) film; and TR represents a transfer gate.

However, for the aforementioned cell capacitor CAP, the height of polysilicon contact 20 arranged beneath lower (platinum) electrode 16 is at most 1 µm. By means of this silicon portion, the energy of the alpha ray generated by $Pt^{190}$ in lower electrode 16 can be reduced to only about 3 MeV. This energy is still high enough to cause a soft error.

It is an object of this invention to provide a type of capacitor, electrode or wiring structure, and a DRAM or other semiconductor device using such structures in which the alpha ray is effectively shielded in order to prevent the occurrence of a soft error even when platinum or some other electroconductive material is used as the electrode of the capacitor or in the wiring structure.

SUMMARY OF THE INVENTION

In accordance with the invention, a capacitor is provided, wherein the capacitor comprises a first electrode layer, an insulating layer formed in contact with the first electrode layer, a second electrode layer formed as the opposite layer with respect to the first electrode layer via the insulating layer, and an conductive layer formed on the side of the second electrode layer. The conductive layer is made of at least one type of simple metal, compound, or alloy selected from the group of nickel, cobalt, copper, and tungsten as simple metals, compounds or alloys made of at least two types of these simple metals, and compounds or alloys made of the aforementioned simple metals and silicon. Here, it is intended that at least a portion of the subjective element, compound, or alloy is present as the principal component.

The case in which the element, compound, or alloy is substantially or completely in 100% proportion is also included.

In particular, this invention is effective when the insulating layer is made of tantalum oxide ($Ta_2O_5$), strontium titanate ($SrTiO_3$), barium strontium titanate ($Ba_xSr_{(1-x)}TiO_3$: BST), or lead zirconate titanate ($PbZr_xTi_{(1-x)}O_3$: PZT), and the second electrode layer and/or the first electrode layer contains platinum.

Also, it is possible to form a diffusion barrier layer for preventing the diffusion of the structural metal element of the insulating layer between the second electrode layer and the conductive layer, and/or the lower portion of the conductive layer.

It is possible to use the conductive layer or diffusion layer as a contact for the diffusion layer, etc., of the semiconductor substrate.

In accordance with the invention, an electrode or wiring structure is also provided wherein a conductive layer is formed in the lower portion of the electrode layer or hard-wire layer. The conductive layer contains at least one type of simple metal, compound or alloy selected from the group of nickel, cobalt, copper, and tungsten as simple metals, compounds, or alloys made of at least two types of these simple metals, and compounds or alloys made of the aforementioned simple metals and silicon.

The electrode or wiring structure is effective when platinum is contained in the electrode layer or hard-wire layer.

A diffusion barrier layer for preventing diffusion of the structural metal element of the conductive layer may be formed between either said electrode layer or hard-wire layer and the conductive layer, and/or in the lower portion of the conductive layer.

In this case, the conductive layer or diffusion barrier layer may be used as a contact.

This invention also provides a semiconductor device having at least one of the following parts: the aforementioned capacitor; the aforementioned electrode or wiring structure; an insulating layer (in particular, an interlayer insulating layer) containing at least one type of simple metal, compound, or alloy selected from the group of nickel, cobalt, copper, and tungsten as simple metals, compounds or alloys made of at least two types of these simple metals, and compounds or alloys made of the aforementioned simple metals and silicon.

Figure 1:
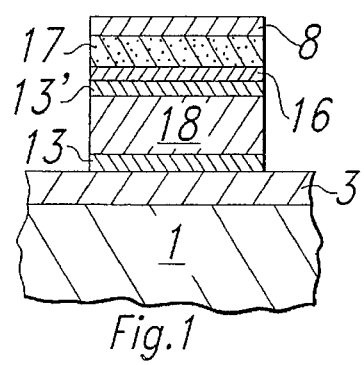
FIG. 1 is a schematic cross-sectional view of a capacitor in an embodiment of the invention.

Reference numerals and symbols as shown in the drawings:

1, silicon substrate
3, hard-wire layer or diffusion layer (diffusion region)
4, diffusion layer (diffusion region)
8, upper electrode
10, 10', 10", interlayer insulating film
11, 12, contact hole
13, 13', diffusion barrier layer
16, lower electrode (Pt electrode)
17, ferroelectric film
18, conductive layer (alpha ray shielding layer)
20, polysilicon layer
21, mold resin CAP, capacitor TR, transistor (transfer gate) WL, wordline BL, bitline

DESCRIPTION OF PREFERRED EMBODIMENTS

The invention will now be explained in more detail with reference to embodiments thereof.

FIGS. 1–7 schematically illustrate various examples of a capacitor constructed in accordance with the invention using a ferroelectric film of metal oxides.

In the characteristic configuration of the capacitor shown in FIG. 1, platinum (Pt) is used to manufacture lower electrode 16 of ferroelectric film 17 made of tantalum oxide, strontium titanate, barium strontium titanate (BST), or lead zirconate titanate (PZT), and a conductive layer 18 made of at least one type selected from the group of the simple metals of Ni, Co, Cu, and W, compounds or alloys made of at least two types of these simple metals, and compounds or alloys made of these simple metals with silicon is arranged beneath said lower electrode 16. For example, ferroelectric film 17 may be made of a PZT film, lower electrode 16 may be made of a Pt layer, and conductive layer 18 may be made of a Ni layer. The upper electrode 8 may be made of Al or Ti.

Figure 4:
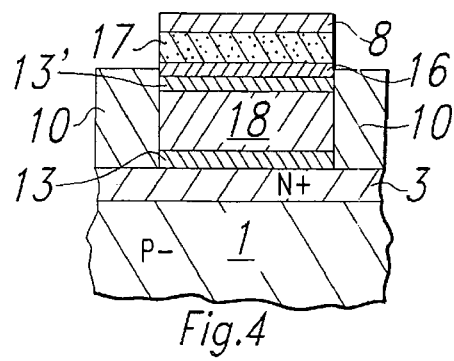
FIG. 4 is a schematic cross-sectional view of a capacitor in another embodiment of the invention.

Electroconductive diffusion barrier layers 13' and 13 (such as a W layer) with small diffusion coefficients are arranged between conductive layer 18 and lower electrode layer 16 and between conductive layer 18 and hard-wire layer 3, respectively, for preventing diffusion of said Ni, etc. inside conductive layer 18, to the other portions. Hard-wire layer 3 may be made of a polysilicon layer. As shown in FIG. 4, it may also be an $n^+$-type semiconductor region 3 formed using the diffusion method on P⁻ type silicon substrate 1 (in this case, the so-called conductive layer 18 is used as the so-called contact; 10 in FIG. 4 represents an insulating layer).

The ferroelectric film 17 may be manufactured using the conventional sol-gel method, CVD method, or the sputtering method to a thickness in the range of 0.05–10 µm. Also, the thickness of the lower electrode 16 may be in the range of 0.05–1 µm.

The conductive layer 18 has a thickness in the range of 0.9–1.3 µm; diffusion barrier layers 13' and 13 have thicknesses in the range of 0.01–1 µm; and the thickness of upper electrode 8 is in the range of 0.01–10 µm. The layers 18, 13', 13, 8, and 16 may be formed using a conventional sputtering method and vacuum deposition method.

Figure 2:
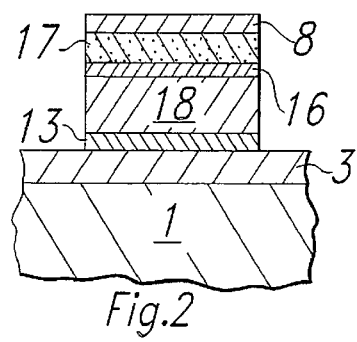
FIG. 2 is a schematic cross-sectional view of a capacitor in another embodiment of the invention.
Figure 3:
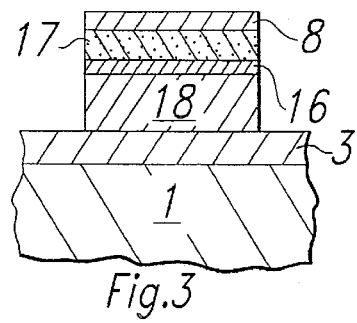
FIG. 3 is a schematic cross-sectional view of a capacitor in another embodiment of the invention.
Figure 7:
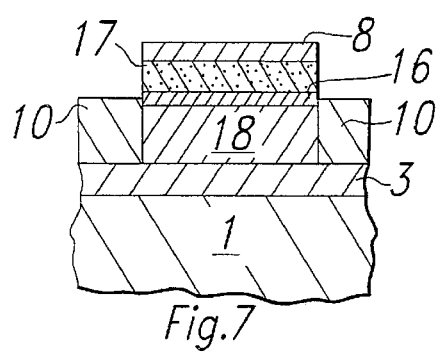
FIG. 7 is a schematic cross-sectional view of a capacitor in another embodiment of the invention.
Figure 5:
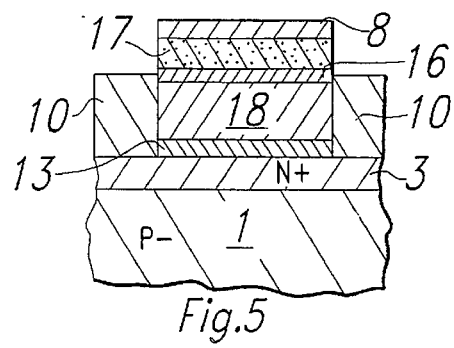
FIG. 5 is a schematic cross-sectional view of a capacitor in another embodiment of the invention.
Figure 6:
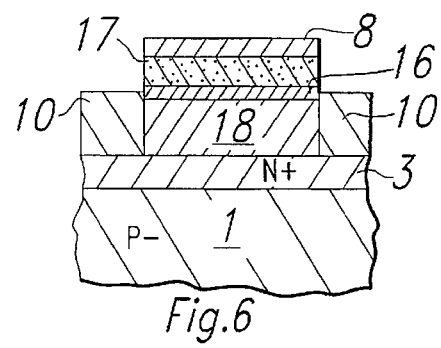
FIG. 6 is a schematic cross-sectional view of a capacitor in another embodiment of the invention.

In the capacitor shown in FIG. 1, the configuration of the diffusion barrier layer 13 may be varied. For example, it is possible to arrange it beneath conductive layer 18 alone as shown in FIGS. 2 and 5, or to arrange it above and below conductive layer 18 as shown in FIGS. 1 and 4; also, it may not be present as shown in FIGS. 3 and 7.

The aforementioned capacitor and its electrode structure of this invention explained in the above can be used preferably for the capacitor (such as a stack-type capacitor) of the memory cell of a dynamic RAM. FIGS. 8–11 illustrate two examples of memory cells of a dynamic RAM.

Figure 8:
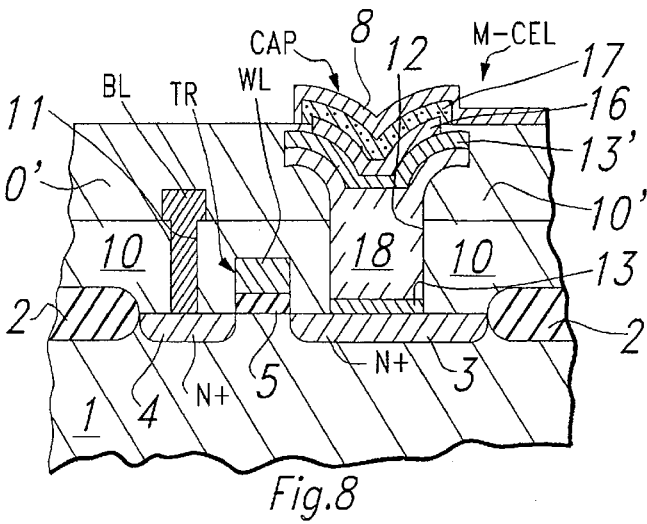
FIG. 8 is an enlarged cross-sectional view taken along line VIII—VIII of FIG. 9 and illustrating a memory cell of a dynamic RAM in which a capacitor with a COB structure is incorporated in accordance with the invention.
Figure 9:
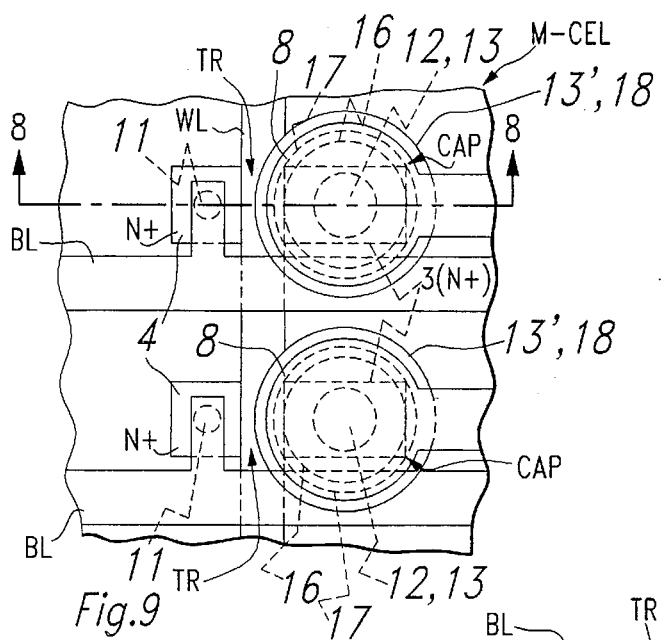
FIG. 9 is an enlarged plan view of the memory cell shown in FIG. 8.

In the example illustrated in FIGS. 8 and 9, element regions defined by field oxide film 2 are formed on one principal surface of p⁻-type silicon substrate 1. Here, transfer gate TR made of MOS transistor and memory cell M-CEL made of capacitor CAP are arranged.

Capacitor CAP has the same substrate structure schematically illustrated in FIG. 4, and a so-called COB structure is formed on the upper portion from bitline BL connected to n⁺-type diffusion region (drain region) 4 through contact hole 11, and conductive layer 18 is used as a contact with respect to n⁺-type diffusion region (source region) 3 (where 10 and 10' represent the interlayer conductive layers).

Figure 10:
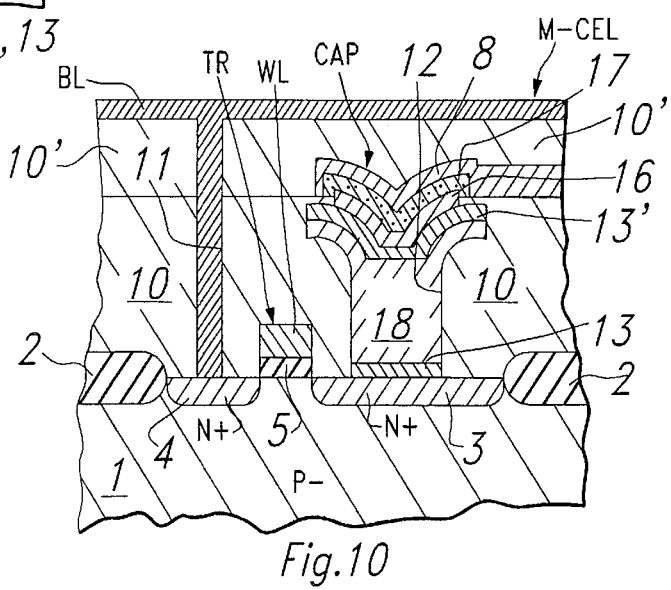
FIG. 10 is an enlarged cross-sectional view taken along line X—X of FIG. 11 and illustrating a memory cell of another dynamic RAM in which a capacitor with a CUB structure is incorporated in accordance with the invention.
Figure 11:
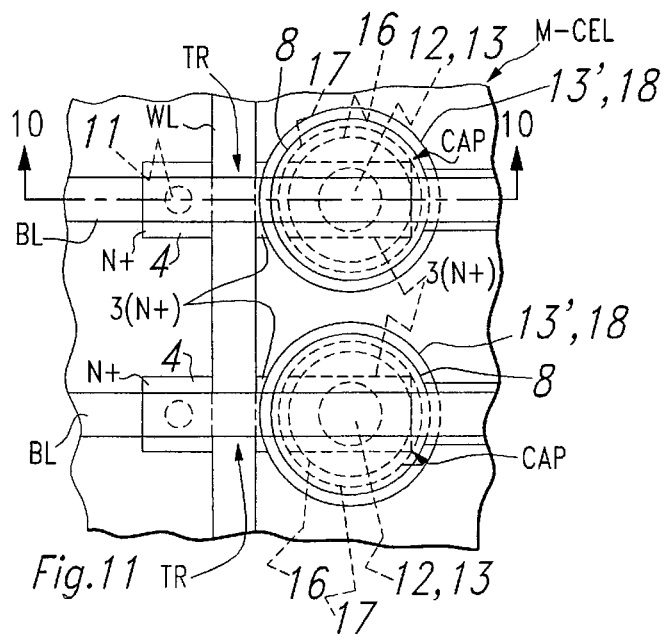
FIG. 11 is an enlarged plan view of the memory cell shown in FIG. 10.

FIGS. 10 and 11 illustrate examples of the so-called CUB (capacitor under bitline) structure with capacitor CAP arranged in the lower portion from bitline BL. Otherwise, this example is identical to the aforementioned example.

As explained above, by using the capacitor of this invention, a Pt electrode with a high oxidation resistance is arranged in contact with a ferroelectric film 17 with a high dielectric constant as lower electrode 16. The conductive layer 18 is arranged to shield off the alpha ray. In this way, it is possible to prevent especially the phenomenon of a soft error caused by an alpha ray emitted from the Pt electrode to reach the side of the semiconductor substrate. The details for the measurement of an alpha ray are explained as follows.

Usually, when an alpha ray emitted from Pt electrode 16 reaches the side of the semiconductor substrate, the charge of the cell capacitor CAP is reduced by the electrons generated by the alpha ray (more specifically, the charge stored in source region 3), and the memory content stored in cell capacitor CAP drops to an undiscernable level. However, if there is little change in the charge of the capacitor even when the alpha ray passes through the layer, the memory is not erased.

Here, the proportion of the electrons generated by the alpha ray and collected by the cell capacitor (the collection efficiency) is κ, the amount of electricity stored in the capacitor is Qs, and the absolute value of the electricity of the electrons is e. Also, the energy of the alpha ray when it is incident on the diffusion layer is Ea, and the energy needed for forming an electron/hole pair is $\epsilon_{pair}$. The condition for no erasure of the memory content of the capacitor by the alpha ray can be represented by the following formula:

$$0.4(Qs/\kappa e)\epsilon_{pair} > Ea$$

In this case, suppose the sensitivity of the sense amplifier of the DRAM is designed appropriately to ensure that when about 60% of the charge in the cell capacitor is left, the memory content can be read correctly. The collection efficiency κ has a value depending on the structure, etc. However, when it is 0.1, one out of 10 electrons is collected to the cell capacitor. Then, as Qs is about $3 \times 10^{-14}$ C., $e = 1.6 \times 10^{-19}$ C., and $\epsilon_{pair} = 3.6$ eV, the aforementioned condition becomes Ea<2.7 MeV.

The energy of the alpha ray generated from $Pt^{190}$ is 3.18 MeV. Under the aforementioned conditions, before the alpha ray emitted from the platinum electrode reaches the diffusion layer of the substrate silicon, it is necessary to decrease the energy to 2.7 MeV.

For this purpose, an effective measure is to arrange an alpha ray shielding material in the lower portion of Pt electrode 16. Another method for preventing the alpha ray is to remove $Pt^{190}$ from the platinum. However, this is impossible in consideration of the cost of the refinement operation. In addition, although the problem can be solved if platinum is not used as the electrode, a substitute electrode is needed. This is nevertheless difficult to realize.

Figure 12:
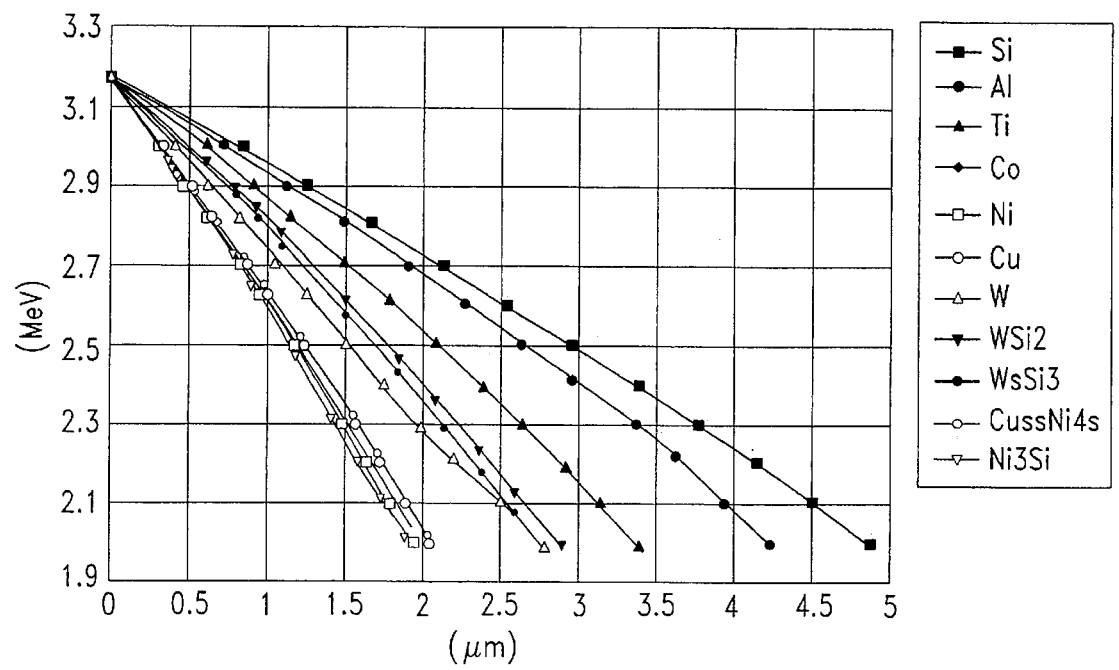
FIG. 12 is a diagram illustrating data of the alpha ray stopping thickness of the various elements.

For the alpha ray shielding materials made of the typical elements or alloys, the thicknesses needed for decreasing the energy of the alpha ray incident at an energy of 3.18 MeV to an energy of 2.7 MeV were derived using the Bethe Bloche formula (see "Butsurigaku Daijiden" [Dictionary of Physics], published by Baifukan, "Ionization loss" section), with results shown in FIG. 12.

Figure 13:
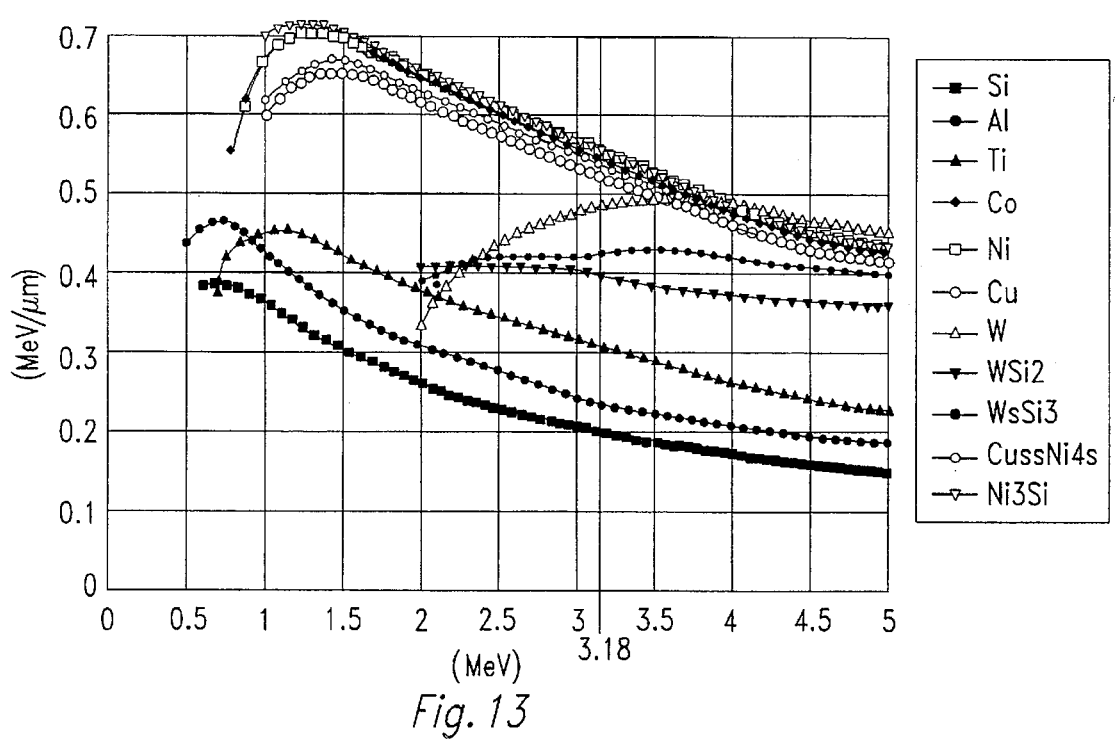
FIG. 13 is a diagram illustrating the data of alpha ray stopping power of the various elements.

As can be seen from FIG. 12, the ranges of flight of alpha rays when the energy of the alpha ray becomes 2.7 MeV, that is, the thicknesses of the shielding materials, are listed in the following Tables I and II. The shielding powers of the various elements and alloys with respect to the alpha ray, that is, the alpha ray stopping powers (the energy decay rate for unit thickness), are shown in FIG. 13. The data of the alpha ray stopping power for realizing the aforementioned necessary attenuation (0.48 MeV) from 3.18 MeV to 2.7 MeV are also listed in the following Tables I and II.

TABLE I

Required Thickness - 3.18 MeV → 2.7 MeV (μm) alpha ray energy decrease

| | Silicon* 2.16 μm | Aluminum 1.88 μm | Titanium 1.48 μm | Copper 0.88 μm | Cobalt 0.87 μm | Nickel 0.86 μm | Tungsten 1.04 μm |
|---|---|---|---|---|---|---|---|
| Alpha Ray Stopping Power (MeV/μm) | 0.222 MeV/μm | 0.255 MeV/μm | 0.324 MeV/μm | 0.545 MeV/μm | 0.551 MeV/μm | 0.560 MeV/μm | 0.462 MeV/μm |

Figure 16:
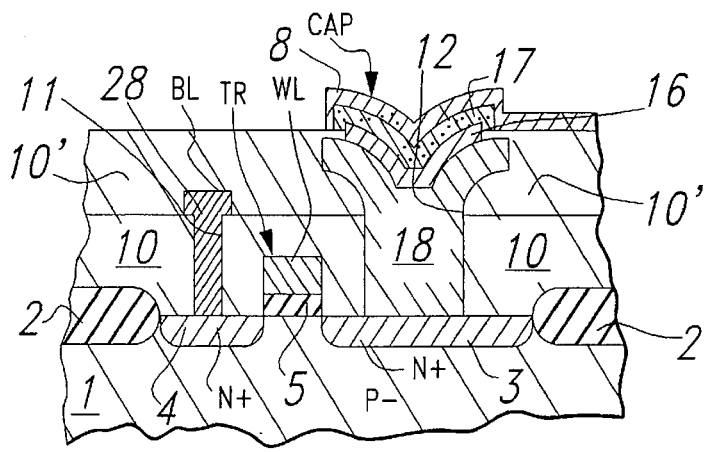
FIG. 16 is an enlarged cross-sectional view of a conventional memory cell of a dynamic RAM in which a capacitor with a COB structure is incorporated.

*Silicon layer 20-conventional example (FIG. 16)

TABLE II

Required Thickness - 3.18 MeV → 2.7 MeV (μm) alpha ray energy decrease

| | $WSi_2$ 1.19 μm | $W_5Si_3$ 1.06 μm | $Cu_{55}Ni_{45}$ 0.84 μm | $Ni_3Si$ 0.84 μm |
|---|---|---|---|---|
| Alpha Ray Stopping Power (MeV/μm) | 0.403 MeV/μm | 0.453 MeV/μm | 0.571 MeV/μm | 0.571 MeV/μm |

From the results, in order to realize the attenuation needed for the energy of the alpha ray, the thickness for silicon, aluminum, and titanium becomes as high as that of the contact connecting the silicon substrate and platinum lower electrode. This is too high, and this is inappropriate. On the other hand, as shown in FIG. 13, copper, cobalt, nickel, $Cu_{55}Ni_{45}$, and $Ni_3Si$ have high alpha ray stopping power in this energy region. If the height of the contact is larger than 1.1 μm, although the stopping power of tungsten, $WSi_2$, or $W_5Si_3$ is not as high as copper, it is possible to decrease the energy of the alpha ray emitted from platinum in the electrode to the desired level. This alpha ray stopping power is effective with respect to the alpha ray emitted from the platinum electrode, and it is also effective for the alpha ray emitted from the other sources (including the external portion of the semiconductor device).

Usually, the substance with a high alpha ray stopping power has a high density and a low mean ionization energy. As the atomic number is increased, the density rises, while the mean ionization energy increases. The elements with high alpha ray stopping power include Co (atomic number 27), Ni (atomic number 28), and Cu (atomic number 29) as explained above. However, for W (atomic number 74) with a higher atomic number, the alpha ray stopping power is high when the alpha ray energy is high. In the vicinity of 3 MeV, where a problem takes place, there is a certain decrease in the alpha ray stopping power, yet it is still relatively high. For Fe (atomic number 26) as a neighbor of Co, the density is not very high, and the alpha ray stopping power is inappropriate.

Based on the aforementioned data, for the structure in an embodiment of this invention (such as the cell in FIG. 8), there is a type of film capacitor, its electrode structure or the contact structure of the silicon substrate characterized by the fact that, instead of the conventional types of contact materials, such as polysilicon, aluminum, titanium, and compounds and alloys of these elements, the material selected from copper, cobalt, nickel, and tungsten as simple metals, or as alloys or compounds made of at least two type of them, or alloys or compounds made of the aforementioned simple metals and silicon, with excellent alpha ray stopping power even with a small thickness, is used as the alpha ray shielding material (the conductive layer 18).

Figure 14:
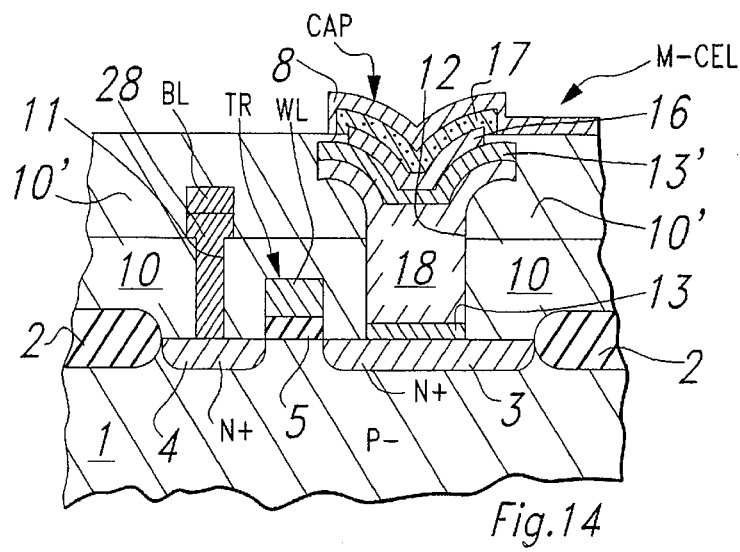
FIG. 14 is an enlarged cross-sectional view of a dynamic RAM having structure incorporated therein in accordance with the invention.

FIG. 14 is a diagram illustrating another application example of the memory cell of a dynamic RAM having alpha ray shielding material based on this invention.

In this embodiment, the characteristic feature different from the aforementioned embodiments (such as the example shown in FIG. 8) is as follows: in the memory cell using platinum in manufacturing bitline BL, contact 28 is formed out of the same type of alpha ray shielding material as above, such as Cu, Co, Ni, W, their compounds or alloys, or their compounds or alloys with silicon.

Consequently, in the configuration of this embodiment, the same effect as above can be realized. In addition, for bitline BL made of platinum, as it has a high electroconductivity, the operation speed can be increased, and, at the same time, the alpha ray emitted from bitline BL can be effectively shielded off by a shielding material (contact) 28. Consequently, it is possible to prevent or suppress invasion of the alpha ray into the $n^+$-type diffusion region 4, and it is possible to reduce the occurrence of soft errors caused by bitline BL.

Figure 15:
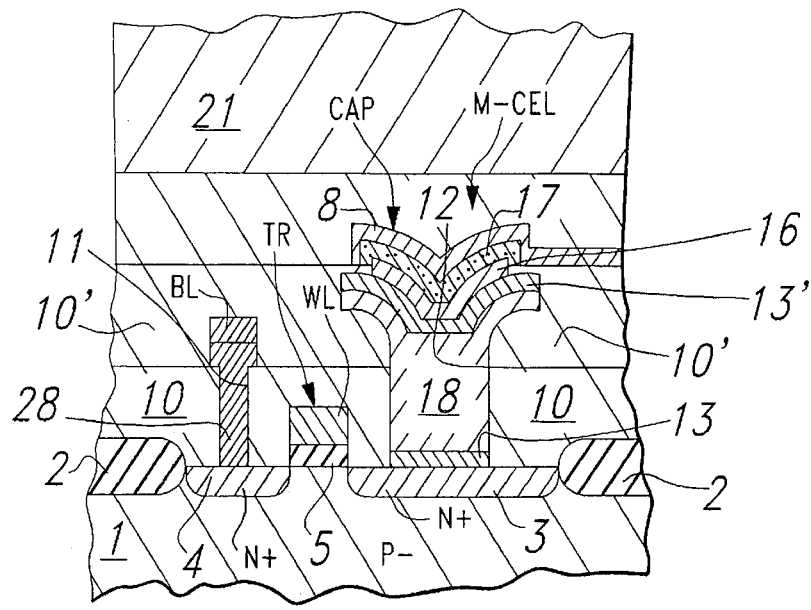
FIG. 15 is an enlarged cross-sectional view of another dynamic RAM having structure incorporated therein in accordance with the invention.

FIG. 15 is a diagram illustrating yet another embodiment of the memory cell of the dynamic RAM having an alpha ray shielding structure.

In addition to the features in the aforementioned examples (such as the examples illustrated in FIGS. 8 and 14), there is the following characteristic feature: interlayer insulating film 10, 10', or 10" is made of the same type of material as the aforementioned alpha ray shielding material, such as Cu, Co, Ni, or W (or their compound or the compound or alloy made of these elements and silicon). This type of interlayer insulating layer can be formed easily by means of sputtering of CuO, etc.

Consequently, for the configuration in this embodiment, the same effects of the aforementioned examples can be realized. Also, it is possible to reduce or prevent the alpha ray emitted from U, Th, or other radioactive elements, unavoidably contained in the filler (such as $SiO_2$, etc.) added for adjusting the thermal expansion coefficient in mold resin 21, from invading the silicon substrate, and it is possible to reduce the soft errors by using mold resin 20.

Usually, when the pretreatment of silica is performed until the content of the aforementioned radioactive elements in the mold resin becomes 10 ppb or less, the cost of the treatment becomes high. On the other hand, in this embodiment, although this treatment is not performed, the alpha ray shielding effect of interlayer insulating layer 10, 10', or 10" is able to reduce the soft errors. Consequently, the cost can be reduced. Also, the aforementioned alpha ray shielding layer can be used for all of interlayer insulating layers 10, 10', and 10", the effect can be displayed even when it is used in making only one of these layers.

In the above, this invention has been used with reference to a number of embodiments. However, other modifications can be made on the basis of the technological ideas of this invention.

For example, the alpha ray shielding layers 18, 28, etc., can be made of any of the metals of Cu, Ni, Co, and W, their compounds or alloys, or their compounds or alloys with silicon. Also, these elements may be added with a prescribed proportion into other layers made of other elements (such as Si) to form an alpha ray shielding layer. In this case, the content added may be in the range of 40–100 mol%, preferably in the range of 70–100 mol%.

In addition to the contact of the bitline explained above, the alpha ray shielding layer can also be arranged in the lower portion of the other metal wiring made of Pt to display the alpha ray stopping power. This is effective for devices other than the aforementioned dynamic RAM.

In the aforementioned cell capacitor, lower electrode 16 contains Pt. When upper electrode 8 also contains Pt, or both electrodes contain Pt, the same alpha ray shielding structure as explained above can be adopted.

The layered structure of the cell capacitor is not limited to that explained above. For example, in the example shown in FIG. 8, diffusion barrier layers 13 and 13' are omitted, or one diffusion barrier layer (such as 13') is omitted, while the other layer is arranged. When a diffusion layer is arranged, it is possible to form the diffusion barrier layer using Ti, W ruthenium (Ru) or their mixture. Also, it may be used as a contact.

For the diffusion barrier layer, as shown in FIG. 14, the same structure as above may be adopted for the bitline and wiring. In addition, it is possible to change the material of ferroelectric film 17, the layout of the cell, etc. Also, this invention can be adopted for various devices in addition to the aforementioned dynamic RAM.

As explained above, in this invention, for the capacitor having an alpha ray source, electrode or wiring, and a layer made of at least one type selected from the group of simple metals of nickel, cobalt, copper, and tungsten, compounds or alloys made of at least two types of these simple metals, and compounds or alloys made of the aforementioned simple metals and silicon is arranged. In this way, this layer is able to shield the alpha ray effectively so that generation of the soft errors can be suppressed. Consequently, it is possible to use Pt or some other new material as the electrode or wiring, so that the cost of the mold resin can be reduced.

We claim:

1. A capacitor comprising:
   a first electrode layer of an electrically conductive material and defining an upper electrode of the capacitor;
   a second electrode layer of an electrically conductive metal susceptible to providing an alpha ray emission and defining a lower electrode of the capacitor, said second electrode layer having first and second major surfaces and being in at least partially registering spaced relationship with respect to said first electrode layer;
   an insulating layer of dielectric material interposed between and in respective engagement with said first electrode layer and the first major surface of said second electrode layer; and
   an electrically conductive layer having an alpha ray shielding characteristic disposed on the second major surface of said second electrode layer opposite from the first major surface of said second electrode layer on which said insulating layer of dielectric material is disposed;
   said electrically conductive layer having the alpha ray shielding characteristic being made of a metal compound, or metal alloy, including at least two metals selected from the group consisting of nickel, cobalt, copper and tungsten.

2. A capacitor as set forth in claim 1, wherein the dielectric material of said insulating layer is selected from the group consisting of tantalum oxide, strontium titanate, barium strontium titanate, and lead zirconate titanate.

3. A capacitor as set forth in claim 1, wherein said second electrode layer of an electrically conductive metal susceptible to providing an alpha ray emission contains platinum.

4. A capacitor as set forth in claim 3, wherein the electrically conductive layer having the alpha ray shielding characteristic is effective to decrease the energy of the alpha ray emission from the platinum of the second electrode layer to a level no greater than 2.7 MeV.

5. A capacitor as set forth in claim 1, wherein said electrically conductive layer has first and second major surfaces, and further including a first diffusion barrier layer interposed between and in respective engagement with the second major surface of said second electrode layer and the first major surface of said electrically conductive layer; and
   a second diffusion barrier layer disposed on the second major surface of said electrically conductive layer, said first and second diffusion barrier layers preventing diffusion of metal included in said electrically conductive layer.

6. A capacitor as set forth in claim 1, wherein said electrically conductive layer has first and second major surfaces, the first major surface of said electrically conductive layer being in engagement with the second major surface of said second electrode layer; and
   further including a diffusion barrier layer disposed on the second major surface of said electrically conductive layer for preventing diffusion of metal included in said electrically conductive layer.

7. A capacitor as set forth in claim 1, wherein said electrically conductive layer has first and second major surfaces, and further including at least one diffusion barrier layer interposed between and in respective engagement with the second major surface of said second electrode layer and the first major surface of said electrically conductive layer for preventing diffusion of metal included in said electrically conductive layer.

8. An electrically conductive component for use in a microcircuit having a semiconductor substrate, said electrically conductive component comprising:
   a first layer of an electrically conductive metal susceptible to providing an alpha ray emission; and
   a second electrically conductive layer having an alpha ray shielding characteristic disposed on said first electrically conductive layer and adapted to be located between said first electrically conductive layer and the semiconductor substrate of the microcircuit;
   said second electrically conductive layer having the alpha ray shielding characteristic being made of a metal compound, or metal alloy, including at least two metals selected from the group consisting of nickel, cobalt, copper and tungsten.

9. An electrically conductive component as set forth in claim 8, wherein said first layer of an electrically conductive metal susceptible to providing an alpha ray emission contains platinum.

10. An electrically conductive component as set forth in claim 9, wherein the second electrically conductive layer having the alpha ray shielding characteristic is effective to decrease the energy of the alpha ray emission from the platinum of the first layer of an electrically conductive metal susceptible to providing an alpha ray emission to a level no greater than 2.7 MeV.

11. An electrically conductive component as set forth in claim 8, wherein each of said first layer of an electrically conductive metal susceptible to providing an alpha ray emission and said second electrically conductive layer having an alpha ray shielding characteristic has first and second major surfaces, and further including a first diffusion barrier layer interposed between and in respective engagement with the second major surface of said first electrically conductive layer and the first major surface of said second electrically conductive layer; and a second diffusion barrier layer disposed on the second major surface of said second electrically conductive layer, said first and second diffusion barrier layers preventing diffusion of metal included in said second electrically conductive layer.

12. An electrically conductive component as set forth in claim 8, wherein each of said first layer of an electrically conductive metal susceptible to providing an alpha ray emission and said second electrically conductive layer having an alpha ray shielding characteristic has first and second major surfaces, the first major surface of said second electrically conductive layer being in engagement with the second major surface of said first electrically conductive layer; and further including a diffusion barrier layer disposed on the second major surface of said second electrically conductive layer for preventing diffusion of metal included in said second electrically conductive layer.

13. An electrically conductive component as set forth in claim 8, wherein each of said first layer of an electrically conductive metal susceptible to providing an alpha ray emission and said second electrically conductive layer having an alpha ray shielding characteristic has first and second major surfaces, and further including at least one diffusion barrier layer interposed between and in respective engagement with the second major surface of said first electrically conductive layer and the first major surface of said second electrically conductive layer for preventing diffusion of metal included in said second electrically conductive layer.

14. An electrically conductive component as set forth in claim 8, wherein the first layer of an electrically conductive metal susceptible to providing an alpha ray emission is a wiring layer.

15. An electrically conductive component as set forth in claim 8, wherein the first layer of an electrically conductive metal susceptible to providing an alpha ray emission is an electrode.

16. A capacitor comprising:

a first electrode layer of an electrically conductive material and defining an upper electrode of the capacitor;

a second electrode layer of an electrically conductive metal susceptible to providing an alpha ray emission and defining a lower electrode of the capacitor, said second electrode layer having first and second major surfaces and being in least partially registering spaced relationship with respect to said first electrode layer;

an insulating layer of dielectric material interposed between and in respective engagement with said first electrode layer and the first major surface of said second electrode layer;

an electrically conductive layer having an alpha ray shielding characteristic disposed on the second major surface of said second electrode layer opposite from the first major surface of said second electrode layer on which said insulating layer of dielectric material is disposed;

said electrically conductive layer having the alpha ray shielding characteristic being made of at least one metal, or compound of such metal, or alloy of such metal wherein the metal is selected from the group consisting of nickel, cobalt, copper and tungsten;

said electrically conductive layer having first and second major surfaces;

a first diffusion barrier layer interposed between and in respective engagement with the second major surface of said second electrode layer and the first major surface of said electrically conductive layer; and a second diffusion barrier layer disposed on the second major surface of said electrically conductive layer, said first and second diffusion barrier layers preventing diffusion of metal included in said electrically conductive layer.

17. A capacitor comprising:

a first electrode layer of an electrically conductive material and defining an upper electrode of the capacitor;

a second electrode layer of an electrically conductive metal susceptible to providing an alpha ray emission and defining a lower electrode of the capacitor, said second electrode layer having first and second major surfaces and being in at least partially registering spaced relationship with respect to said first electrode layer;

an insulating layer of dielectric material interposed between and in respective engagement with said first electrode layer and the first major surface of said second electrode layer;

an electrically conductive layer having an alpha ray shielding characteristic disposed on the second major surface of said second electrode layer opposite from the first major surface of said second electrode layer on which said insulating layer of dielectric material is disposed;

said electrically conductive layer having the alpha ray shielding characteristic being made of at least one metal, or compound of such metal, or alloy of such metal wherein the metal is selected the group consisting of nickel, cobalt, copper and tungsten;

said electrically conductive layer having first and second major surfaces; and at least one diffusion barrier layer interposed between and in respective engagement with the second major surface of said second electrode layer and the first major surface of said electrically conductive layer for preventing diffusion of metal included in said electrically conductive layer.

18. A capacitor comprising:

a first electrode layer of an electrically conductive material and defining an upper electrode of the capacitor;

a second electrode layer of an electrically conductive metal susceptible to providing an alpha ray emission and defining a lower electrode of the capacitor, said second electrode layer having first and second major surfaces and being in at least partially registering spaced relationship with respect to said first electrode layer;

an insulating layer of dielectric material interposed between and in respective engagement with said first electrode layer and the first major surface of said second electrode layer;

an electrically conductive layer having an alpha ray shielding characteristic disposed on the second major surface of said electrode layer opposite from the first major surface of said second electrode layer on which insulating layer of dielectric material is disposed;

said electrically conductive layer having the alpha ray shielding characteristic being made of a silicon-containing metal compound, or a silicon-containing metal alloy, wherein the metal in the silicon-containing metal compound or the silicon-containing metal alloy is selected from the group consisting of nickel, cobalt, copper and tungsten;

said electrically conductive layer having first and second major surfaces;

a first diffusion barrier layer interposed between and in respective engagement with the second major surface of said second electrode layer and the first major surface of said electrically conductive layer; and a second diffusion barrier layer disposed on the second major surface of said electrically conductive layer, said first and second diffusion barrier layers preventing diffusion of metal included in said electrically conductive layer.

19. A capacitor comprising:

a first electrode layer of an electrically conductive material and defining an upper electrode of the capacitor;

a second electrode layer of an electrically conductive metal susceptible to providing an alpha ray emission and defining a lower electrode of the capacitor, said second electrode layer having first and second major surfaces and being in at least partially registering spaced relationship with respect to said first electrode layer;

an insulating layer of dielectric material interposed between and in respective engagement with said first electrode layer and the first major surface of said second electrode layer;

an electrically conductive layer having an alpha ray shielding characteristic disposed on the second major surface of said second electrode layer opposite from the first major surface of said second electrode layer on which said insulating layer of dielectric material is disposed;

said electrically conductive layer having the alpha ray shielding characteristic being made of a silicon-containing metal compound, or a silicon-containing metal alloy, wherein the metal in the silicon-containing metal compound or the silicon-containing metal alloy is selected from the group consisting of nickel, cobalt, copper and tungsten;

said electrically conductive layer having first and second major surfaces; and at least one diffusion barrier layer interposed between and in respective engagement with the second major surface of said second electrode layer and the first major surface of said electrically conductive layer for preventing diffusion of metal included in said electrically conductive layer.

20. An electrically conductive component for use in a microcircuit having a semiconductor substrate, said electrically conductive component comprising:

a first layer of an electrically conductive metal susceptible to providing an alpha ray emission;

a second electrically conductive layer having an alpha ray shielding characteristic disposed on said first electrically conductive layer and adapted to be located between said first electrically conductive layer and the semiconductor substrate of the microcircuit;

said second electrically conductive layer having the alpha ray shielding characteristic being made of at least one metal or compound of such metal, or alloy of such metal, wherein the metal is selected from the group consisting of nickel, cobalt, copper and tungsten;

each of said first layer of an electrically conductive metal susceptible to providing an alpha ray emission and said second electrically conductive layer having an alpha ray shielding characteristic having first and second major surfaces;

a first diffusion barrier layer interposed between and in respective engagement with the second major surface of said first electrically conductive layer and the first major surface of said second electrically conductive layer; and a second diffusion barrier layer disposed on the second major surface of said second electrically conductive layer, said first and second diffusion barrier layers preventing diffusion of metal included in said second electrically conductive layer.

21. An electrically conductive component for use in a microcircuit having a semiconductor substrate, said electrically conductive component comprising:

a first layer of an electrically conductive metal susceptible to providing an alpha ray emission;

a second electrically conductive layer having an alpha ray shielding characteristic disposed on said first electrically conductive layer and adapted to be located between said first electrically conductive layer and the semiconductor substrate of the microcircuit;

said second electrically conductive layer having the alpha ray shielding characteristic being made of at least one metal or compound of such metal, or alloy of such metal, wherein the metal is selected from the group consisting of nickel, cobalt, copper and tungsten;

each of said first layer of an electrically conductive metal susceptible to providing an alpha ray emission and said second electrically conductive layer having an alpha ray shielding characteristic having first and second major surfaces; and at least one diffusion barrier layer interposed between and in respective engagement with the second major surface of said first electrically conductive layer and the first major surface of said second electrically layer for preventing diffusion of metal included in said second electrically conductive layer.

22. An electrically conductive component for use in a microcircuit having a semiconductor substrate, said electrically conductive component comprising:

a first layer of an electrically conductive metal susceptible to providing an alpha ray emission;

a second electrically conductive layer having an alpha ray shielding characteristic disposed on said first electrically conductive layer and adapted to be located between said first electrically conductive layer and the semiconductor substrate of the microcircuit;

said second electrically conductive layer having the alpha ray shielding characteristic being made of a silicon-containing metal compound or a silicon-containing metal alloy, wherein the metal in the silicon-containing metal compound or the silicon-containing metal alloy is selected from the group consisting of nickel, cobalt, copper and tungsten;

each of said first layer of an electrically conductive metal susceptible to providing an alpha ray emission and said second electrically conductive layer having an alpha ray shielding characteristic having first and second major surfaces;

a first diffusion barrier layer interposed between and in respective engagement with the second major surface of said first electrically conductive layer and the first major surface of said second electrically conductive layer; and a second diffusion barrier layer disposed on the second major surface of said second electrically conductive layer, said first and second diffusion barrier layers preventing diffusion of metal included in said second electrically conductive layer.

23. An electrically conductive component for use in a microcircuit having a semiconductor substrate, said electrically conductive component comprising:

a first layer of an electrically conductive metal susceptible to providing an alpha ray emission;

a second electrically conductive layer having an alpha ray shielding characteristic disposed on said first electrically conductive layer and adapted to be located between said first electrically conductive layer and the semiconductor substrate of the microcircuit;

said second electrically conductive layer having the alpha ray shielding characteristic being made of a silicon-containing metal compound or a silicon-containing metal alloy, wherein the metal in the silicon-containing metal compound or the silicon-containing metal alloy is selected from the group consisting of nickel, cobalt, copper and tungsten;

each of said first layer of an electrically conductive metal susceptible to providing an alpha ray emission and said second electrically conductive layer having an alpha ray shielding characteristic having first and second major surfaces; and at least one diffusion barrier layer interposed between and in respective engagement with the second major surface of said first electrically conductive layer and the first major surface of said electrically conductive layer for preventing diffusion of metal included in said second electrically conductive layer.

* * * * *